(12) United States Patent
Chang et al.

(10) Patent No.: US 10,923,557 B2
(45) Date of Patent: Feb. 16, 2021

(54) ACTIVE-MATRIX LIGHT-EMITTING DIODE (AMOLED) FREE OF TFT WITHIN AN ACTIVE AREA

(71) Applicant: AROLLTECH CO., LTD., Grand Cayman (KY)

(72) Inventors: Yih Chang, New Taipei (TW); Yusheng Chang, New Taipei (TW)

(73) Assignee: AROLLTECH CO., LTD., Grand Cayman (KY)

( * ) Notice: Subject to any disclaimer, the term of this patent is extended or adjusted under 35 U.S.C. 154(b) by 0 days.

(21) Appl. No.: 16/577,618

(22) Filed: Sep. 20, 2019

(65) Prior Publication Data

US 2020/0098846 A1 Mar. 26, 2020

Related U.S. Application Data

(60) Provisional application No. 62/733,837, filed on Sep. 20, 2018.

(51) Int. Cl.
*H01L 27/32* (2006.01)
*H01L 51/00* (2006.01)

(52) U.S. Cl.
CPC ...... *H01L 27/3276* (2013.01); *H01L 51/0096* (2013.01); *H01L 2251/533* (2013.01); *H01L 2251/5315* (2013.01)

(58) Field of Classification Search
CPC ............. H01L 27/3276; H01L 51/0096; H01L 2251/5338
See application file for complete search history.

(56) References Cited

U.S. PATENT DOCUMENTS

2019/0013339 A1* 1/2019 Li ........................... H01L 27/02

* cited by examiner

*Primary Examiner* — Anthony Ho
(74) *Attorney, Agent, or Firm* — Muncy, Geissler, Olds & Lowe, PC

(57) ABSTRACT

An AMOLED free of TFT in the active area includes a first substrate; an organic light-emitting diode (OLED) device disposed on the first substrate; a plurality of conductive lines disposed on the first substrate; and connected to the OLED device; and a driving device having TFT functions, connected to the OLED device through the conductive lines, configured to drive the OLED device, and disposed outside of the active area.

13 Claims, 14 Drawing Sheets

US 10,923,557 B2

ACTIVE-MATRIX LIGHT-EMITTING DIODE (AMOLED) FREE OF TFT WITHIN AN ACTIVE AREA

TECHNICAL FIELD

The present disclosure relates to an active matrix organic light emitting diode (AMOLED), and more particularly, to an AMOLED free of TFT within an active area.

DISCUSSION OF THE BACKGROUND

Currently, active-matrix OLED (AMOLED) displays, are widely used in electronic devices. AMOLED is an OLED display formed directly on the TFT (thin film transistor) substrate and driven by these transistors to each sub-pixel of OLED. Resolution and brightness are two of most critical display parameters for the OLED display. However, for some present and next-wave electronic devices, resolution and brightness of existing OLED displays cannot meet requirements. Therefore, there is a need to provide a new OLED display to address the above issue.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides an AMOLED free of TFT within an active area. The AMOLED includes a first substrate; an organic light-emitting diode (OLED) device disposed on the first substrate; a plurality of conductive lines disposed on the first substrate and connected to the OLED device; and a driving device having TFT functions, connected to the OLED device through the conductive lines, and configured to drive the OLED device, and disposed outside of the active area.

In some embodiments, the first substrate is a polyimide (PI) substrate or an ultra-thin glass (UTG) substrate.

In some embodiments, the driving device is disposed on one of the first and second surfaces of the first substrate.

In some embodiments, the AMOLED further includes a passivation layer disposed on the OLED device, wherein the OLED device provides a top-emission function.

In some embodiments, the OLED device is disposed on the first substrate by being formed on the first substrate.

In some embodiments, the AMOLED further includes a second substrate, disposed on the OLED device, wherein the OLED device provides a bottom-emission function.

In some embodiments, the second substrate is disposed on the OLED device by formation of the OLED device on the second substrate.

In some embodiments, the second substrate is disposed on the OLED device by formation of the OLED device on the first substrate.

Another aspect of the present disclosure provides an AMOLED. The AMOLED includes a first substrate comprising a first surface, a second surface opposite to the first surface, a first region and a second region adjacent to the first region; an organic light-emitting diode (OLED) device, disposed on the first surface and above the first region; and a driving device configured for driving the OLED device and disposed on the second surface and under the second region, wherein the first region is disposed within an active area of the AMOLED, and the second region is disposed within a non-active area of the AMOLED.

In some embodiments, the AMOLED is free of a thin-film transistor (TFT).

In some embodiments, the AMOLED further includes an interconnect, disposed in the first substrate and penetrating from the first surface to the second surface of the first substrate, and configured for electrical connection to the OLED device.

In some embodiments, the AMOLED further includes a plurality of conductive lines disposed on the first substrate and coupling the interconnect to the driving device.

In some embodiments, the OLED device disposed above the driving device is absent.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1A:
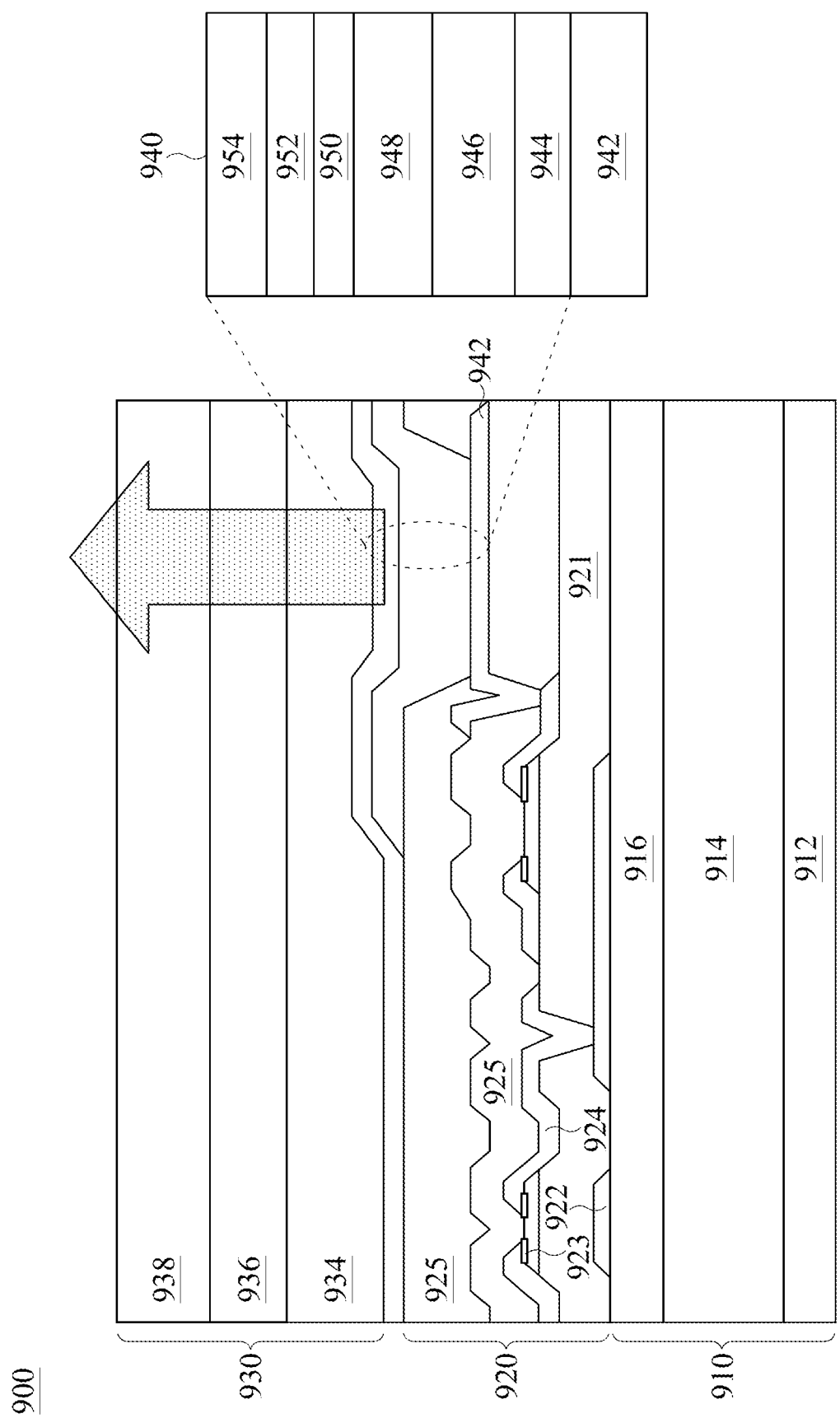
FIG. 1A is a prior art and shows a cross-sectional view of a comparative AMOLED with OLED device having a function of a top-emission.

Embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness of features may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearance of the phrases "in some embodiments" or "in an embodiment" in various places throughout this specification does not necessarily refer to the same embodiment. Furthermore, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific terms) used herein have the same meanings as those commonly understood by a person having ordinary skill in the art to which the embodiments of the present disclosure belong. It should be understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

As display technology has evolved, displays have included cathode ray tube (CRT), liquid-crystal display (LCD), light-emitting diode (LED), and, more recently, active-matrix organic light-emitting diode (AMOLED). In recent years, since an AMOLED provides a superior form factor, self-emitting capability, lighter weight, and a better performance, such as a response time, AMOLED has replaced LCD as the main approach to display technology.

However, AMOLED may no longer be able to meet requirement of new applications, such as virtual reality (VR), augmented reality (AR), mixed reality (MR) and 3D volumetric holography. These new applications generally require higher frame rates (for example, greater than about 128 frames per second (fps)), greater brightness (above 1,000 nits), and extremely high resolution (for example, greater than 1,000 pixels per inch, ppi). The reasons for which AMOLED may no longer be able to meet requirements are briefly summarized below.

An AMOLED is mainly composed of an OLED front plane and a thin-film transistor (TFT) substrate (alternatively referred to as a backplane substrate). The OLED front plane sits on the TFT substrate, and functions to emit light while being driven. The TFT substrate functions to drive the OLED front plane. Generally, the TFT substrate includes a plurality of transistors, capacitors, and other active or passive electrical components. The transistors include switching transistors and driving transistors. In some embodiments, the transistors include a p-channel metal-oxide-transistor (MOS) (PMOS), an n-channel MOS (NMOS), or a complementary MOS (CMOS). Generally, the transistors and the capacitors in combination function to drive a sub-pixel of the OLED front plane. In this invention, the TFT function is defined as one that has a plurality of transistors, which include scanning and driving transistors and optionally compensation transistors, capacitors, and other active or passive electrical components, and is used to drive each sub-pixel of the OLED device.

An LCD display is normally driven by a TFT with 2 transistors and 1 capacitor because the LCD is a voltage driven device with a high voltage applied to turn on a liquid crystal to align to the light shining from the backlight beneath the TFT. These 2 transistors include one switching and another driving transistor with one capacitor to store the electrical charge to maintain the voltage high enough to turn on the LCD. However, an OLED is a current driven self-emitting device. In order to overcome the current uniformity of each sub-pixel and at the same time to adjust the threshold voltage shift due to unstable underlying gate channel made from amorphous-Si ($\alpha$-Si), low-temperature poly-silicon (LTPS), or zinc oxide, such as indium gallium zinc oxide (IGZO), besides one switching and another driving transistors, there are 2 to 4 additional compensation transistors, really depending on the products and applications.

Generally, a pixel of an AMOLED includes three to four sub-pixels, depending of the applications and products. In the case where the pixel includes three sub-pixels, the three sub-pixels are respectively a red sub-pixel, a green sub-pixel, and a blue sub-pixel. In the case where the pixel includes four sub-pixels, the fourth sub-pixels further include a white sub-pixel.

Dimensions of both the transistor of a TFT substrate and a sub-pixel of an AMOLED are factors in determining a resolution of an AMOLED. For example, if an AMOLED is requested to have a resolution of about 1,000 ppi, dimension of a pixel of the AMOLED is less than about 25.4 micrometer ($\mu$m). In a case where the pixel includes three sub-pixels, dimension of about 25.4 $\mu$m is shared by the three sub-pixels. That is, dimension available for one sub-pixel of the three sub-pixels is required to be less than 8.46 $\mu$m.

Generally, a sub-pixel of an AMOLED includes three to six transistors, and two to three capacitors. If a sub-pixel includes six transistors, dimension available for one transistor of the non-overlapping six transistors is required to be less than 1.41 µm. However, due to limitations of existing thin-film semiconductor manufacturing technology, it is likely not possible to manufacture a transistor having a size less than 1.41 µm. That is, it is not possible to propose an AMOLED having a resolution of 1,000 ppi, or higher, such as 2,000 ppi to 4,000 ppi. Moreover, both TFT and OLED adopt different method to define and manufacture the required resolution. TFT uses the photolithography to define each of gate, source, and drain metal resolution. However, the OLED critical resolution is defined with a fine metal mask in the high vacuum deposition processes. Once the OLED manufacturing technology can overcome and achieve even higher resolution, the TFT resolution will become more critical since each of OLED sub-pixel is driven by more than 5 to 6 transistors.

For the next-wave AR/MR applications with resolution up to 4,000 ppi, which is anticipated as being an ideal resolution for AR and 3D volumetric holography, dimensions of both a transistor of a TFT substrate and a sub-pixel of an AMOLED will present major obstacles to AMOLED development. Therefore, for an AMOLED to separate TFT and OLED with TFT integrated into ICs or other devices outside the active area region, the new OLED display will only need to resolve the precision fine metal mask design rules to make display resolution more than 1,000 ppi.

In addition, performance of an AMOLED depends on performance of a channel material of a transistor of a TFT substrate. With current technology, the channel material of the transistor consists of α-Si, LTPS, or IGZO. The carrier mobility provided by α-Si is generally below about 10 $cm^2/(V \cdot s)$, the carrier mobility provided by LTPS is below about 100 $cm^2/(V \cdot s)$, and the carrier mobility provided by IGZO is below about 30 $cm^2/(V \cdot s)$. These mobilities are well below the crystal Si in IC industries, which is about 500~1,000 $cm^2/(V \cdot s)$. Generally, for the existing AMOLED in a mobile phone application, LTPS is selected as a channel material of a transistor. For the existing AMOLED in a TV application, IGZO is selected for a channel material of a transistor. If the next-wave AMOLED reaches more than 128 fps and 16K TV and beyond, the existing channel materials no longer meet these requirements. Therefore, for an AMOLED to separate TFT and OLED with TFT integrated into IC or other device with single crystal Si as the channel materials, the mobility to reach more than 500 $cm^2/(V \cdot s)$ can meet the future AMOLED product requirement.

Further, if the next-wave AMOLED is requested to be fully transparent, a transistor of a TFT substrate will become one of a major obstacle to development due to the opaque features of both LTPS and α-Si channel material and three metals of source, drain, and gate for just one transistor, which will put more design constraints to design transparent AMOLED. Another critical factor for the transparent AMOLED is the optical cavity effect from both TFT and OLED, if OLED sits directly on TFT substrate. OLED has more than 7 layers with just one cathode being non-transparent. However, TFT has more than 6 stacked layers with just one gate insulator being transparent. When simulate the optical cavity to calculate the light pass through from the OLED and bounce back and forth, the design of transparency from each specific layer thickness and refractive index becomes difficult when there are many absorption and reflective layers from the TFT. Therefore, for an AMOLED to separate TFT and OLED with TFT integrated into ICs or other devices outside the active area, this new OLED display will be beneficial to manufacture transparent AMOLED.

Moreover, the future OLED front plane is designed to provide a high brightness beyond 5,000 $cd/m^2$ or nits, almost 10 times brighter than about 600 nits today. That means the photons generated by the OLED front plane will increase 10 times for each of a color pixel of red, green and blue, wherein generally, excited photon energy for a color pixel of red is about 1.8 eV; for a color pixel of green is about 2.3 eV; and for a color pixel of blue is about 3.1 eV.

Intrinsic bandgap of channel materials of both α-Si and LTPS is about 1.1 eV, and intrinsic bandgap of a channel material of IGZO is about 3.1 eV. Intrinsic bandgap of α-Si, LTPS and IGZO are significantly less than the excited photon energy of color pixels of red, green and blue, which results in generation of additional free carriers along a channel of a transistor. Since the OLED front plane sits on a TFT substrate, which means that the OLED front plane and the TFT substrate are integrated and the TFT substrate is in an active area of the OLED front plane, the greater brightness will incur more noise and degrade performance of the transistor. As a result, performance of the AMOLED is adversely affected. Therefore, for an AMOLED to separate TFT and OLED with transistors outside of active area, this new AMOLED display will allow OLED device emit the light intensity more than 1,000,000 nits.

Furthermore, in order to achieve a higher performance of an AMOLED, it is required to implement a PMOS or a CMOS in a TFT substrate because AMOLED is normally driven by a common cathode, not by a common anode, due to limitations of the existing OLED production technology. However, due to limitations of existing thin-film semiconductor manufacturing technology, only an NMOS is easily formed with less photomask processes. And it is difficult to form a PMOS due to the intrinsic high level of hydrogen in a channel of a transistor, wherein hydrogen is created during the deposition processes of α-Si, LTPS, and IGZO. As a result, performance of an AMOLED is adversely affected. Therefore, for an AMOLED to separate TFT and OLED with driving device to replace TFT functions outside of active area using crystal Si to make CMOS can speed up and stabilize AMOLED display.

In summary, AMOLED performance is limited by thin-film semiconductor manufacturing technology on a glass substrate and by integration of a thin-film transistor (TFT) driving plane and an OLED front plane. To achieve the high performance required of OLED devices, the present disclosure will address at least one of those issues.

FIG. 1A is a prior art and shows a typical cross-sectional view of a comparative AMOLED 900 with OLED device having a function of a top-emission. Referring to FIG. 1A, the AMOLED 900 includes a substrate 910, a TFT layer 920, a package 930, and an OLED 940. The substrate 910 includes a buffer layer 912, a flexible substrate 914, a buffer layer 916. The buffer layers 912 and 916 are disposed at the opposite sides of the substrate 914. The TFT layer 920 includes a passivation layer 921, a gate metal 922, a channel layer 923, a data metal 924, and a bank 925. The OLED device 940 includes, a pixel electrode 926 (an anode), a hole injection layer (HIL) 944, a hole transport layer (HTL) 946, an emission layer (EML) 948, a buffer layer (BL) 950, an electron transport layer (ETL) 952, and a cathode 954. The cathode 954 is so-called transparent cathode. The package 930 includes a thin film encapsulation, an adhesive layer 936, and a hard coat 938.

Figure 1B:
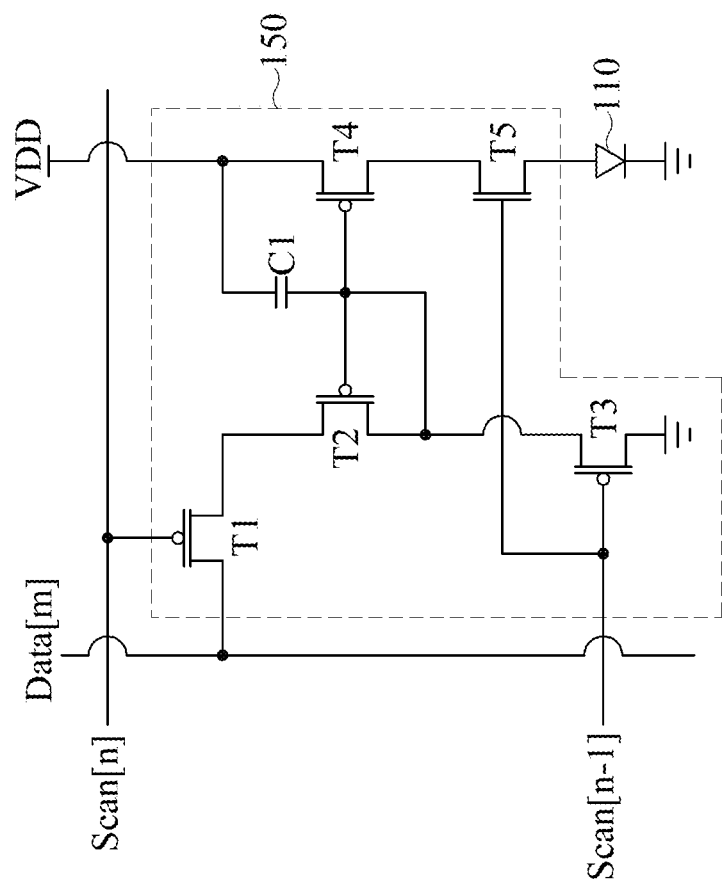
FIG. 1B is a prior art and shows a typical circuit diagram of an AMOLED with a circuit including a 5T1C structure.

FIG. 1B is a prior art and shows a typical circuit diagram of a circuit 1000 including a 5T1C structure. Referring to FIG. 1B, the circuit 1000 includes the driving device 150 and the OLED device 110. The driving device 150 includes transistors T1, T2, T3, T4 and T5, and a capacitor C1. The driving device 150 defines the TFT function to drive OLED device 110 with active matrix scheme of duty ratio equal to 1 to independently address and light on each sub-pixel of OLED device 110. The duty ratio equal to 1 is because the capacitor C1 will store the charge to maintain turn-on state of T4 to allow the current flow from $V_{DD}$ to light on the sub-pixel of OLED device 110.

FIG. 1 shows an AMOLED which is composed of the OLED device 940 disposed directly on TFT substrate 920 with pixel anode 942 connected to the data metal 924. FIG. 1A shows a typical fully transparent common cathode AMOLED with cathode 954, bank 925, and passivation layers 921 being all transparent. FIG. 1A and FIG. 1B show the OLED will emit the light directly pass through TFT channel to create electron-hole pairs to generate more noise to deteriorate the AMOLED. And at the same time, the 5T1C transistor layout will limit the AMOLED resolution based on FIG. 1A parallel transistor design.

Figure 2:
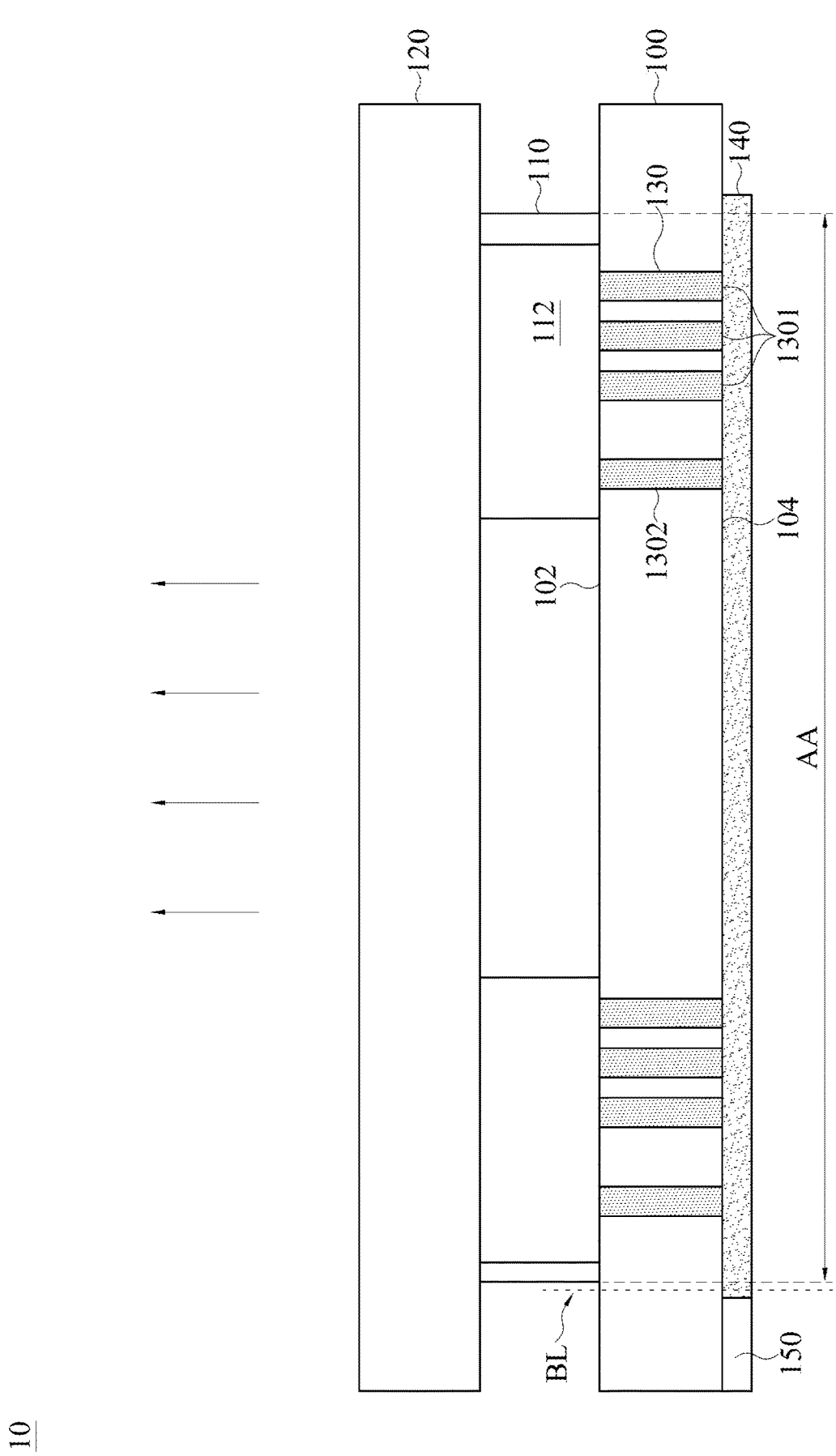
FIG. 2 is a cross-sectional view of an AMOLED display with a top-emission function, in accordance with some embodiments of the present disclosure.

FIG. 2 is a cross-sectional view of an active matrix organic light-emitting diode (AMOLED) display 10 with a top-emission (that is, an electromagnetic radiation or light is emitted along a direction as shown by arrows in FIG. 2) function, in accordance with some embodiments of the present disclosure. It should be noted that thicknesses of elements shown in FIG. 2 are exaggerated for better understanding. Referring to FIG. 2, the AMOLED display 10 includes a substrate 100, an OLED device 110, a passivation layer 120, an interconnect 130, a redistribution layer 140, and a driving device 150.

The substrate 100, including a first surface 102 and a second surface 104, functions to support the OLED device 110. In some embodiments, the substrate 100 is defined as a substrate on which the OLED device 110 is formed by, for example, an evaporation process. In some embodiments, the substrate 100 is transparent. In some embodiments, the substrate 100 is a polyimide (PI) substrate or an ultra-thin glass (UTG, with glass thickness defined less than 100 micrometers) substrate. In some embodiments, the substrate 100 includes PI or UTG.

The OLED device 110 is disposed on the first surface 102 of the substrate 100. In some embodiments, the OLED device 110 is entirely in contact with the first surface 102 of the substrate 100. In some embodiments, the substrate 100 includes a first region, and a second region adjacent to the first region. In such embodiment, the OLED device 110 is disposed above the first region.

The OLED device 110 includes a plurality of pixels 112. For clarity, only two pixels 112 are illustrated. The pixel 112 includes a plurality of sub-pixels. In some embodiment, the pixel includes a green sub-pixel, a blue sub-pixel, and a red sub-pixel.

In some embodiments, each sub-pixel includes two electrode layers (not shown) and a middle layer (not shown). Materials of both the two electrode layers and the middle layer are appropriately selected to perform top emission.

The two electrode layers are at outermost layers of the OLED device 110. That is, one of the two electrode layers is disposed on and entirely in contact with the first surface 102 of the substrate 100, and the other of the two electrode layers is covered by the passivation layer 120. Further, one of the two electrode layers serves as one of a cathode and an anode of the OLED device 110, and the other one of the two electrode layers serves as the other one of the cathode and the anode. The cathode of the OLED device 110 may selectively use metal or the alternative layers of metal and conductive oxides (so called transparent cathode) to achieve a function of top emission.

The middle layer is disposed between the two electrode layers. The middle layer, for example, includes a hole injection layer (HIL), a hole transportation layer (HTL), an emission layer (EL), and an electron transportation layer (ETL). The HIL functions for hole injection from an anode of the OLED device 110. The HTL functions for hole transport from the HIL to the EL. The EL is a layer where an electron and a hole are recombined to form an exciton, which generates light emission with various colors such as red, green, and blue. The ETL functions for electron transport from an EIL and a cathode of the OLED device 110 and transport of electrons to the EL.

A driving device 150 is configured for switching and driving the OLED device 110 including other compensation functions, and the driving device 150 is not disposed between the OLED device 110 and the substrate 100. In the present disclosure, there is no TFT substrate disposed between the OLED device 110 and the substrate 100. That is, there is no transistor for driving the OLED device 110 disposed between the OLED device 110 and the substrate 100. As a result, performance of the AMOLED display 10 is relatively high, compared to the existing AMOLED displays.

In some embodiments, the driving device 150 includes a plurality of transistors, each of which is coupled to the one of the corresponding sub-pixel through the redistribution layer 140 and interconnect 130.

In some embodiments, a width of the OLED device 110 is substantially less than a width of the substrate 100 and a width of the passivation layer 120.

In further detail, the driving device 150 is disposed on the second surface 104 of the substrate 100. However, the present disclosure is not limited thereto. In some embodiments, the driving device 150 may be disposed on first surface or another substrate and have an electrical connection with the redistribution layer 140 and interconnect 130. In some embodiments, the driving device 150 is manufactured using silicon (Si) wafer semiconductor manufacturing technology. As a result, dimension of the driving device 150 is significantly small. For example, dimension of each transistor of the driving device 150 is in a scale of several nanometers (e.g., about 7 nanometers (nm)). For example, the dimension of the driving device 150 is significantly smaller than that of a transistor manufactured by thin-film semiconductor manufacturing technology, resulting in a better performance of the AMOLED display 10. In some embodiments, the driving device 150 is integrated with other integrated circuits, such as a power and memory management and time control to become one integrated circuit (IC).

The driving device 150 is coupled to the OLED device 110 by the redistribution layer 140 and the interconnect 130. In further detail, the redistribution layer 140 is a collective stacked layer of the electrically conductive lines connected between OLED device 110 and the interconnect 130. The redistribution layer 140 is disposed on the second surface 104 of the substrate 100 and coupled between the interconnect 130 and the driving device 150. In some embodiments, the redistribution layer 140 is disposed on the first surface or both the first and second surfaces. In some embodiments, the driving device 150 is disposed on a flex (flexible printed circuit (FPC) or a chip on film (COF)) and is accordingly coupled to the redistribution layer 140.

In some embodiments, materials of the redistribution layer 140 and interconnect 130 include copper (Cu), aluminum (Al), or other high electrical conductivity materials. The redistribution layer 140 may be also made of transparent conductive oxides or the mixture or alternative layers of metal and conductive oxides to make fully transparent AMOLED. The interconnect 130 is disposed in and penetrates the substrate 100. In some embodiments, the interconnect 130 extends between the first surface 102 and the second surface 104 of the substrate and is configured for electrical connection to the OLED device 110. In some embodiments, the interconnect 130 includes a contact. In the present embodiment, the interconnect 130 includes a first interconnect 1301 and a second interconnect 1302. The first interconnect 1301 is responsible for electrical connection of a sub-pixel of the pixel 112. The second interconnect 1302 is responsible for electrical connection of the remaining function, as will be described in detail with reference to FIGS. 9 and 10.

The first interconnect 1301 and the second interconnect 1302 electrically connects a sub-pixel of the OLED device 110 and the driving device 150 by means of the redistribution layer 140 and through a via hole. In some embodiments, the via hole refers to a hole in which the first interconnect 1301 and the second interconnect 1302 are formed. Diameter of the interconnect 130 is determined according to dimension of a sub-pixel of the OLED device 110 and a manufacturing technology to etch the via hole in a glass. The manufacturing technology of etch is performed on the substrate 100. The diameter of the via hole generally is limited to less than an aspect ratio of about 5. That is, if dimension of one sub-pixel is about 25 µm with 4 parallel interconnects with gap, between the interconnects, of each being about 2 µm, the diameter of the via hole for each interconnect will be about 4 µm. In this case, a thickness of the UTG is limited to be less than about 20 µm. As a result, a thickness for each of the UTG or PI has to be chosen, depending on resolution of the OLED device 110.

The passivation layer 120, disposed on the OLED device 110, serves as the outermost layer of the AMOLED display 10 to protect and seal the OLED device 110 from, for example, scratching and water, oxygen, and contamination, which would deteriorate the OLED device 110. In some embodiments, the passivation layer 120 is a PI substrate or a UTG substrate. In some embodiments, the passivation layer 120 includes PI or UTG. In some embodiments, the passivation layer 120 includes alternating layer containing the similar materials as in the substrate 100 and organic materials.

In some embodiments, when viewing in a direction normal to the substrate 100 or the AMOLED display 10, borders of the OLED device 110 define an active area (AA) of the AMOLED display 10 therewithin. As such, the driving device 150, when viewing in the normal direction, is disposed outside of the active area (AA), and the redistribution layer 140 extends outside of the active area (AA) to connect the driving device 150. Hence, it is noted that the active area AA of the AMOLED display 10 used hereinafter represents an area defined by the borders of the OLED device 110 viewed from the normal direction. As shown in the drawings FIG. 2 of the present disclosure, in some embodiments, the OLED device 110 extends to locations at one side of each border line BL of the borders of the OLED device 110, and the driving device 150 extends to locations at the other side of the border line BL, such that the OLED device 110 does not overlap with the driving device 150 along the normal direction. Such arrangement could prevent a quantity of photons generated by the OLED device 110 from entering the driving device 150, thereby preventing an unexpected excitation of electrons in a channel of a transistor of the driving device 150. As a result, performance of the AMOLED display 10 is relatively high, compared to the existing AMOLED displays.

Moreover, in such embodiments, the first region of the substrate 100 is disposed within the active area (AA) of the AMOLED display 10, and the second region of the substrate 100 is disposed within a non-active area of the AMOLED display 10.

In some embodiments, the AMOLED display 10 has TFT driving functions, but the structure thereof is free of a TFT within the active area of the first substrate. That is, during a process of manufacturing the AMOLED display 10, no thin-film semiconductor manufacturing process is involved to form a TFT thereon, but instead an IC or device chip with the TFT driving functions is provided to connect with and to drive the OLED device 110 of the AMOLED display 10. In one aspect of the invention, AMOLED display 10, which is free of TFT within the active area AA, has a type of addressing scheme that is actively driven by the driving device 150, which is disposed outside of the active area AA, to maintain each sub-pixel state while other sub-pixels are being addressed.

Figure 3:
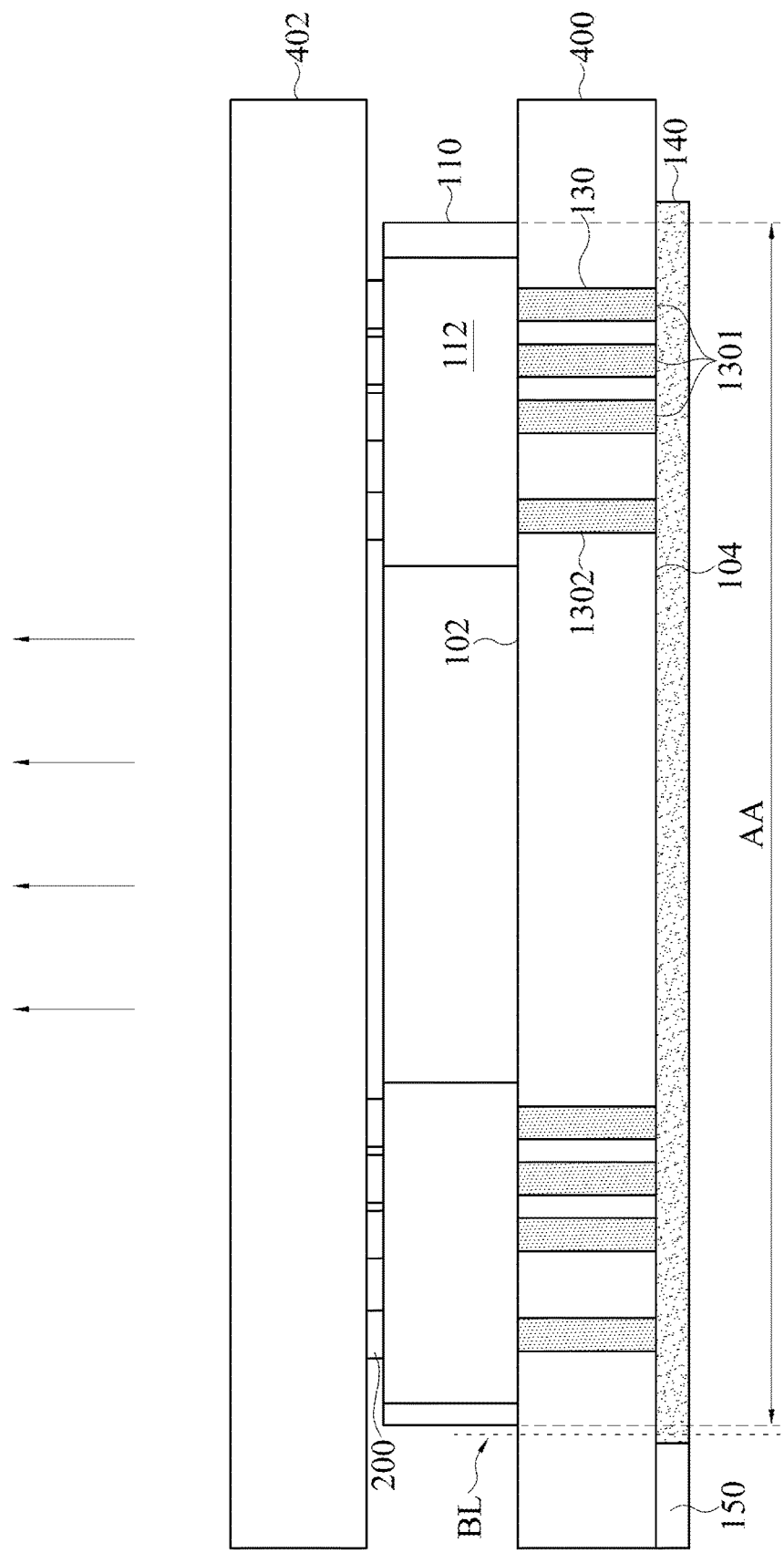
FIG. 3 is a cross-sectional view of another AMOLED display with a top-emission function, in accordance with some embodiments of the present disclosure.

FIG. 3 is a cross-sectional view of another AMOLED display with a top-emission function, in accordance with some embodiments of the present disclosure. Referring to FIG. 3, the AMOLED display 20 is similar to the AMOLED display 10 described and illustrated with reference to FIG. 2 except that, for example, the AMOLED display 20 includes a first substrate 400, a second substrate 402 and a color filter 200. Function of the first substrate 400 is the same as that of the substrate 100 shown in FIG. 2, and therefore the detailed descriptions are not repeated herein.

The color filter 200 is disposed on the OLED device 110 and is aligned with the corresponding sub-pixel of the OLED device 110 on the first substrate 100 to bond and seal the OLED device 110. In further detail, in some embodiments, the color filter 200 is formed on the second substrate 402. After the formation of the color filter 200, the second substrate 402 and the color filter 200 are flipped and disposed onto the OLED device 110. However, the present disclosure is not limited thereto. The present disclosure includes other suitable approaches to form the color filter 200.

In operation, the pixel 112 of the OLED device 110 may emit white light in a top-emission manner toward the color filter 200. The color filter 200 functions to transform the white light into red light, green light, or blue light.

Figure 4:
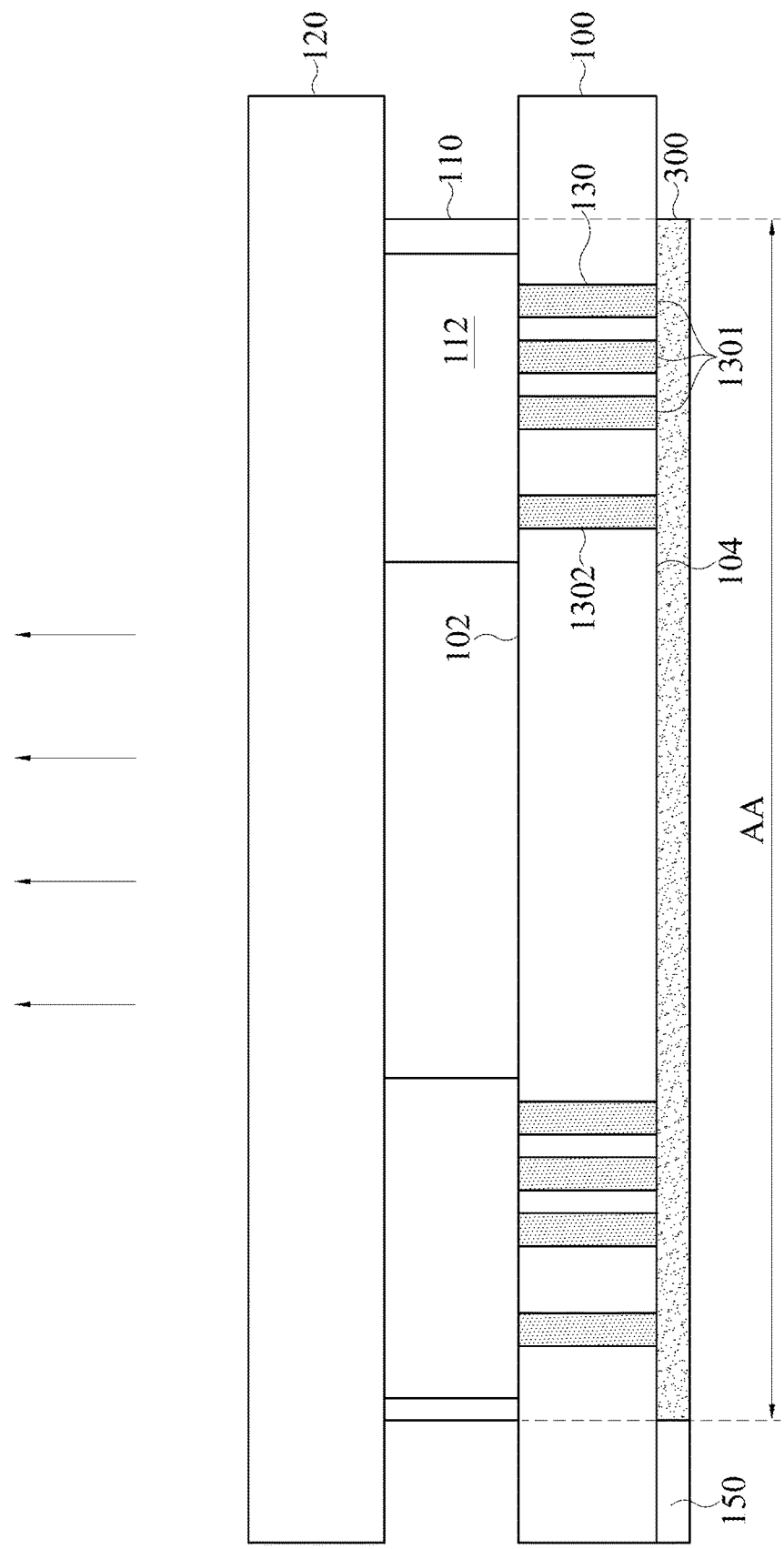
FIG. 4 is a cross-sectional view of further another AMOLED display with a top-emission function, in accordance with some embodiments of the present disclosure.

FIG. 4 is a cross-sectional view of another AMOLED display with a top-emission function, in accordance with some embodiments of the present disclosure. Referring to FIG. 4, the AMOLED display 30 is similar to the OLED display 10 described and illustrated with reference to FIG. 2 except that, for example, the AMOLED display 30 includes a redistribution layer 300. The redistribution layer 300 is similar to the redistribution layer 140 described and illustrated with reference to FIG. 2 except that, for example, borders of the redistribution layer 300 are aligned with borders of the OLED device 110.

Similar to the embodiment of FIG. 2, the driving device 150 does not overlap with the OLED device 110 along the normal direction and is entirely separated from the OLED device 110 in a direction in which the redistribution layer 300 extends. As a result, performance of the AMOLED display 30 is relatively high, compared to the existing AMOLED displays.

Figure 5:
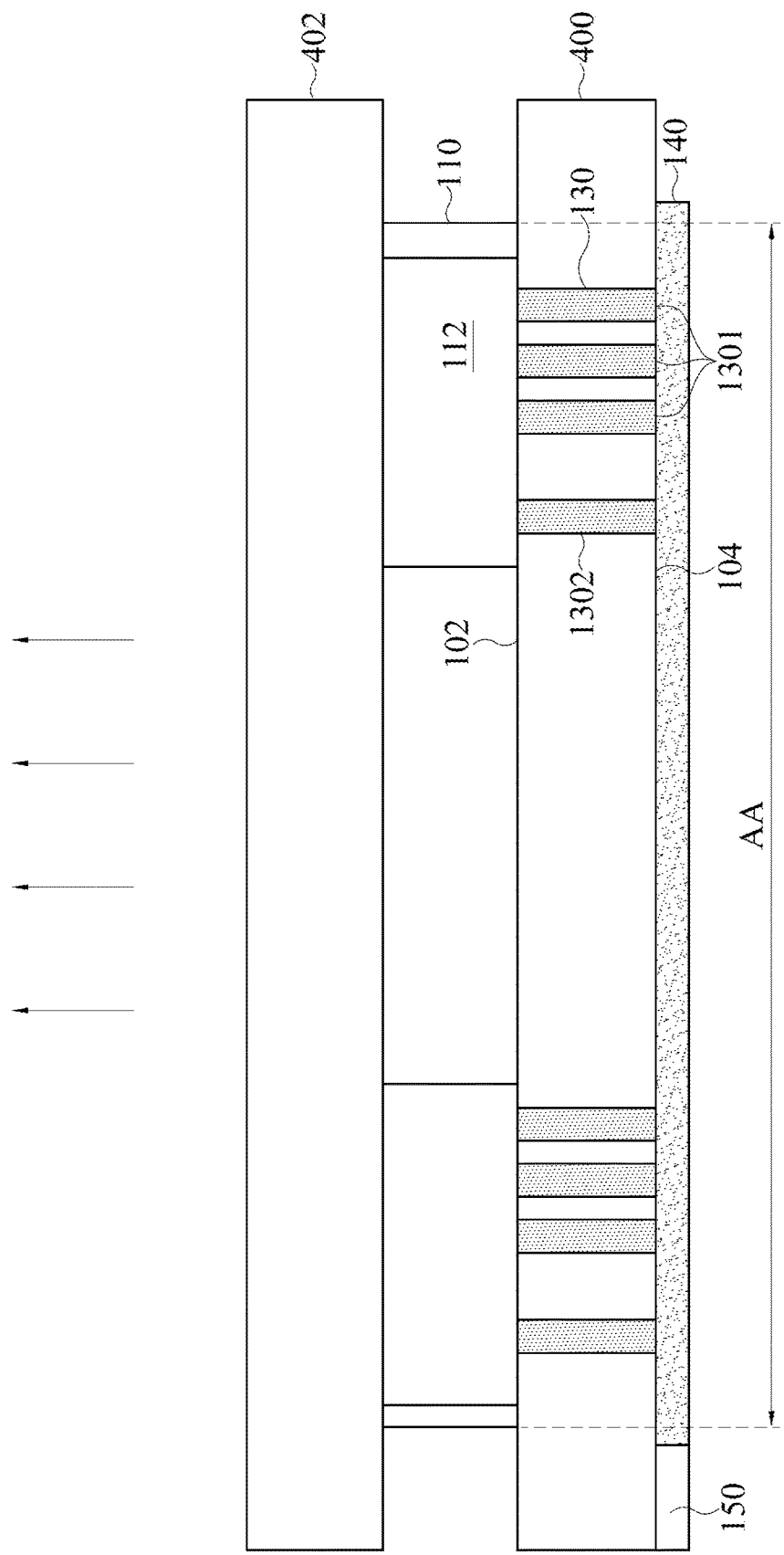
FIG. 5 is a cross-sectional view of an AMOLED display with a bottom-emission function, in accordance with some embodiments of the present disclosure.

FIG. 5 is a cross-sectional view of an AMOLED display 40 with a bottom-emission (that is, an electromagnetic radiation or light is emitted along a direction as shown by arrows in FIG. 5) function, in accordance with some embodiments of the present disclosure. It should be noted that materials of two electrode layers and a middle layer of the OLED device 110 are appropriately selected to perform bottom emission.

Referring to FIG. 5, the AMOLED display 40 is similar to the AMOLED display 20 described and illustrated with reference to FIG. 3 except that, for example, the AMOLED display 40 performs a bottom emission.

The first substrate 400 serves as a cover substrate, and functions to both protect and seal the OLED device 110 and also serves as a substrate to interconnect the OLED device 110 to the driving device 150. The second substrate 402 is defined as a substrate on which the OLED device 110 is formed by, for example, an evaporation process. After a formation (that is, the second substrate 402 is integrated with the OLED device 110), the second substrate 402 and the OLED device 110 are flipped and attached to the first substrate 400. However, the present disclosure is not limited to such manufacturing procedure. In other embodiments, the OLED device 110 is formed on the first substrate 100, and the OLED device 110 is configured into a structure to perform a bottom emission. In this case, an electromagnetic radiation or light is emitted along the opposite direction opposite along which the light is emitted as shown in FIG. 5.

The attachment between the first substrate 400 and the second substrate 402, in order to seal and protect the OLED device 110 from water and oxygen when operation, may use glass frit bonding along the display edge or other direct bonding methods directly attaching the OLED device 110 to the first substrate 400. The inter layers of this attachment, if any, are on the orders of few nanometers with compositions at least some being similar to the first substrate 400 and the second substrate 402. The glass frit bonding is a locally high temperature process and normally applied along the display edge to prevent damaging the OLED device 110. There are several direct bonding methods in high vacuum with different pressure levels, some are in the room temperature and others are in the temperature higher than the room temperature. However, this attachment will not affect performance of the OLED device 110.

In some embodiments, the first substrate 400 and the second substrate 402 extend across the active area region AA and a region outside the active area region AA. In some embodiments, the first substrate 400 and the second substrate 402 extend across the border line BL. In some embodiments, the driving device 150 is disposed below the second substrate 402. In some embodiments, the first substrate 400 and the second substrate 402 is a PI substrate or a UTG substrate. In some embodiments, the first substrate 400 and the second substrate 402 include PI or UTG. In some embodiments, the first substrate 400 includes similar materials as in the second substrate 402. The driving device 150 is coupled to the OLED device 110 by the redistribution layer 140 and the interconnect 130 disposed on the first substrate 400. In further detail, the redistribution layer 140 is disposed on the second surface 104 of the substrate 400 and coupled between the interconnect 130 and the driving device 150. In some embodiments, a least a portion of the second substrate 402 is disposed over the driving device 150. In some embodiments, the OLED device 110 disposed above the driving device 150 is absent.

Figure 6:
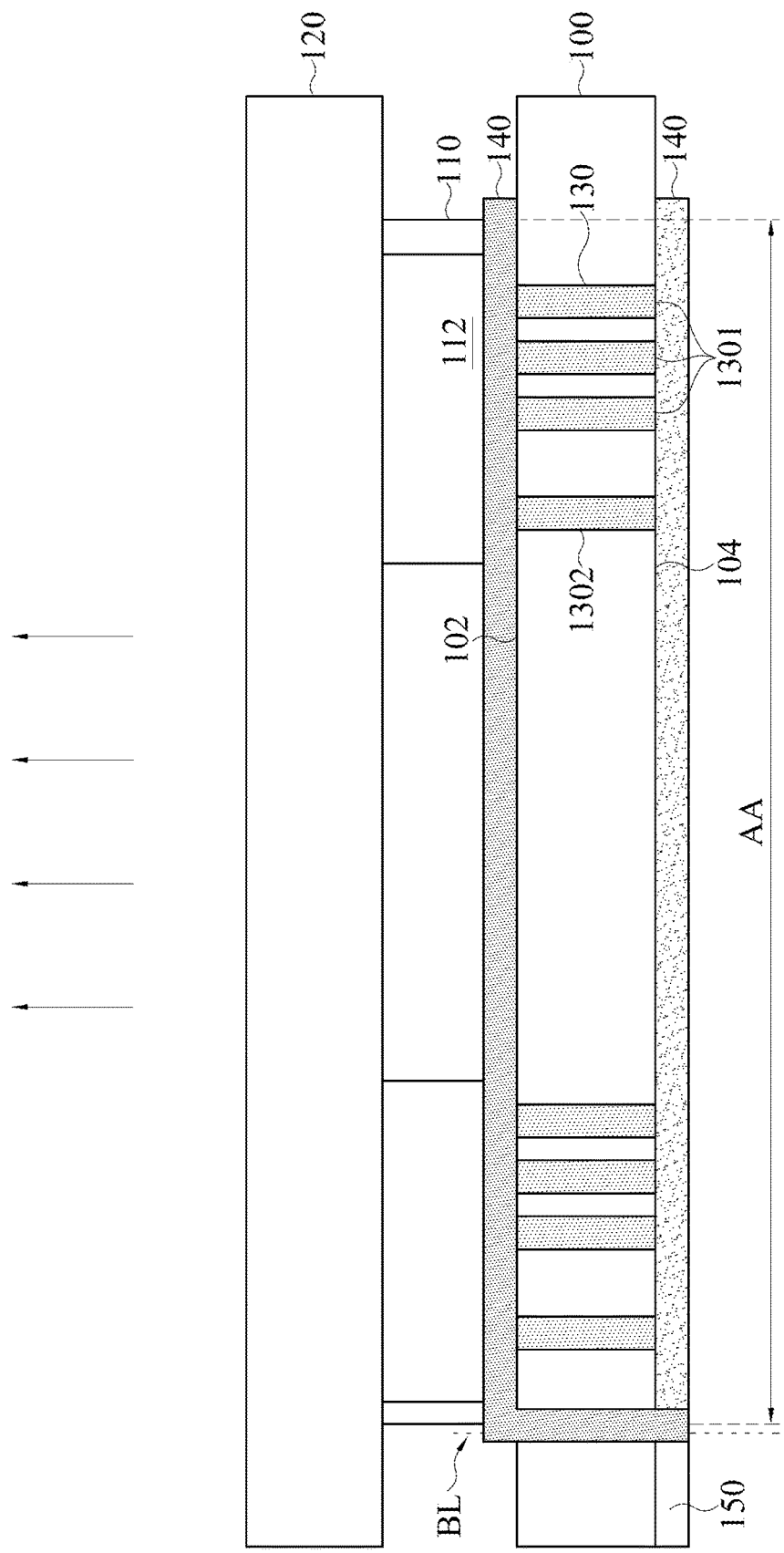
FIG. 6 is a cross-sectional view of an AMOLED display with a top-emission function, in accordance with some embodiments of the present disclosure.

FIG. 6 is a cross-sectional view of an AMOLED display 50 with a top-emission function, in accordance with some embodiments of the present disclosure. Referring to FIG. 6, the redistribution layers 140 are disposed on both the first surface 102 and the second surface 104 of the substrate 100. In further detail, FIG. 6 shows the redistribution layers 140 are disposed at the same time on the first surface 102 and the second surface 104 to allow the OLED device 110 design the anode and cathode in different surfaces, which then connect to the driving device 110 through via holes. Even in some further embodiments, the redistribution layer 140 is only disposed on the first surface and connected to driving device 150 without penetrating into the substrate 110 through via holes. (not shown in the figure).

Figure 7:
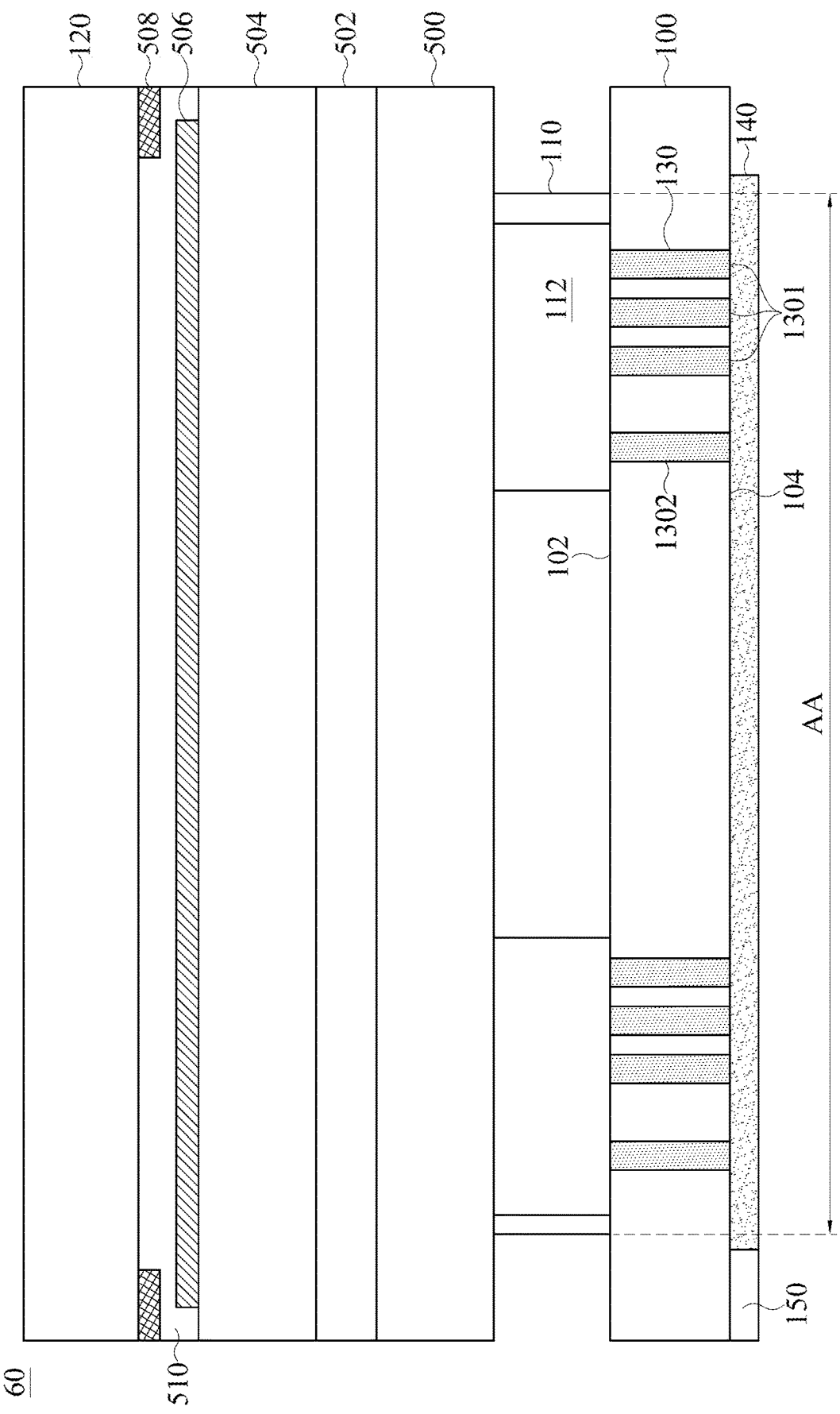
FIG. 7 is a cross-sectional view of an AMOLED display with a touch function, in accordance with some embodiments of the present disclosure.

FIG. 7 is a cross-sectional view of an AMOLED display 60 with a touch function, in accordance with some embodiments of the present disclosure. Referring to FIG. 7, the AMOLED display 60 is similar to the OLED display 10 described and illustrated with reference to FIG. 2 except that, for example, the AMOLED display 60 further includes a first cover layer 500, a first adhesive layer 502, a second cover layer 504, a touch sensor 506, a black matrix 508, and a second adhesive layer 510.

The first cover layer 500 is disposed on the OLED device 110. In some embodiments, the first cover layer 500 is a PI substrate or a UTG substrate. In some embodiments, the first cover layer 500 includes PI or UTG. The second cover layer 504 is attached to the first cover layer 500 via the first adhesive layer 502. In some embodiments, the second cover layer 504 is a polyethylene terephthalate (PET) substrate, a PI substrate or a UTG substrate. In some embodiments, the second cover layer 504 includes PET, PI or UTG. In some embodiments, the first cover layer 500 includes materials same as or different from materials in the second cover layer 504. In some embodiments, material of the first adhesive layer 502 includes an optically clear adhesive (OCA) or an optically clear resin (OCR).

The touch sensor 506 is disposed on the second cover layer 504. In some embodiments, the touch sensor 506 forms a touch panel. The black matrix 508 is disposed under the passivation layer 120 and disposed at side portions of the AMOLED device 60. The passivation layer 120 is attached to the second cover layer 504 via the second adhesive layer 510. In some embodiments, material of the second adhesive layer 510 includes an OCA or an OCR.

In some embodiments, the first cover layer 500, the first adhesive layer 502, the second cover layer 504, the second adhesive layer 510 and the passivation layer 120 extend across the active area region AA and a region outside the active area region AA. In some embodiments, the first cover layer 500, the first adhesive layer 502, the second cover layer 504, the second adhesive layer 510 and the passivation layer 120 extend across the border line BL.

Figure 8:
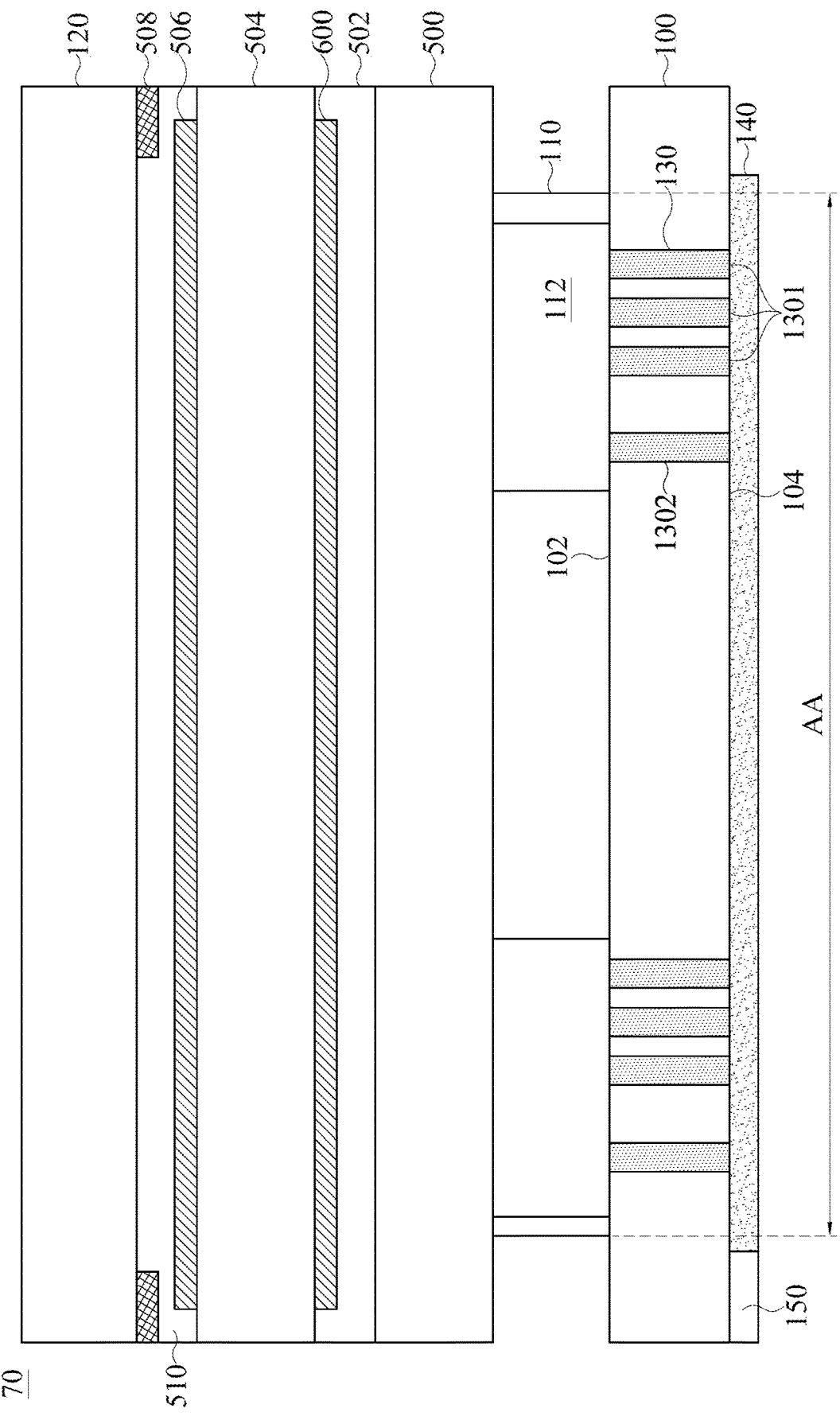
FIG. 8 is a cross-sectional view of another AMOLED display with a touch function, in accordance with some embodiments of the present disclosure.

FIG. 8 is a cross-sectional view of another AMOLED display 70 with a touch function, in accordance with some embodiments of the present disclosure. Referring to FIG. 8, the AMOLED display 70 is similar to the AMOLED display 60 described and illustrated with reference to FIG. 7 except that, for example, the AMOLED display 70 further includes a second touch sensor 600. Both the second touch sensor 600 and the first touch sensor 506 are disposed of the both sides of the second cover layer 504 and adhered to the first cover layer 500 via the first adhesive layer 502 and adhered to the passivation layer 120 via second adhesive layer 510. In some embodiments, both the second touch sensor 600 and the first touch sensor 506 forma touch panel.

Figure 9:
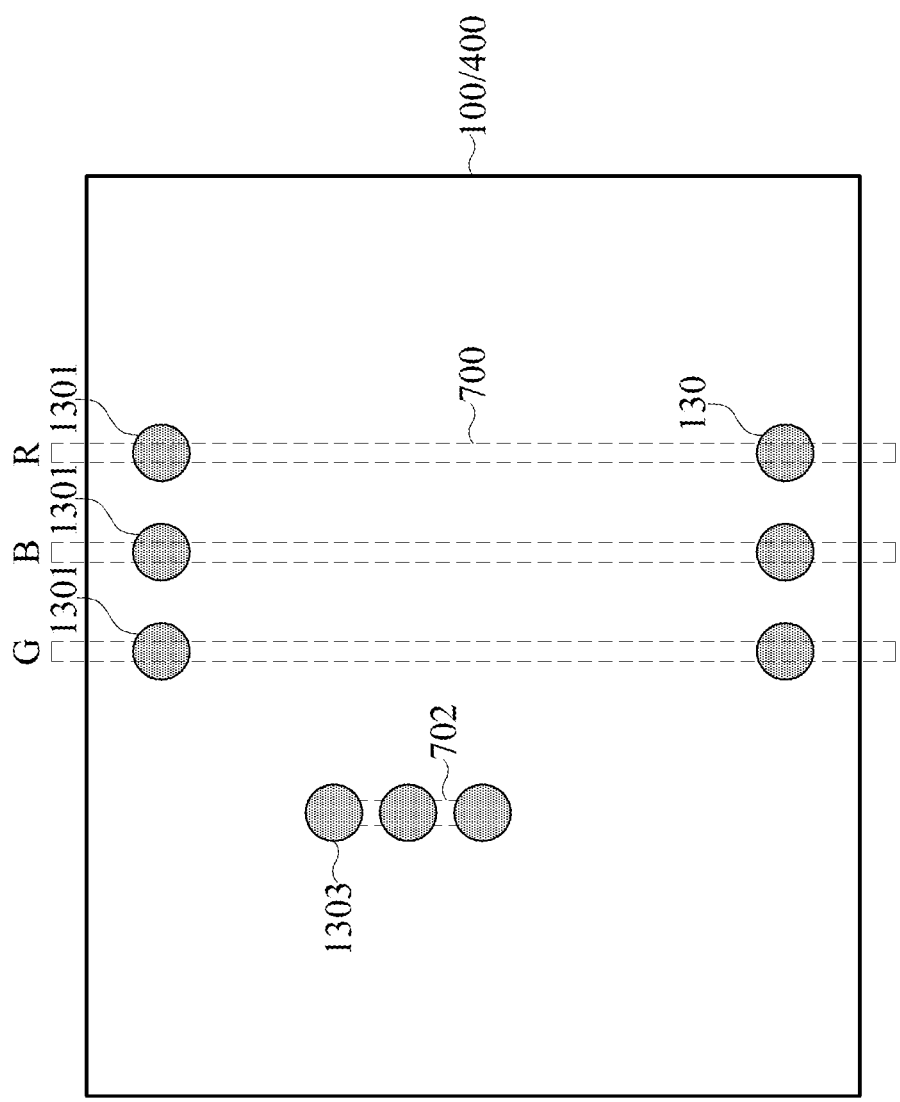
FIG. 9 is a layout of an AMOLED display from a top view, in accordance with some embodiments of the present disclosure.

FIG. 9 is a layout of AMOLED displays 10, 20, 30, 40, 50 and/or 60 from a top view, in accordance with some embodiments of the present disclosure. Referring to FIG. 9 for the pixel 112, for clarity, the substrate 100 (or the first substrate 400) is depicted, and only the interconnects 130 (a first interconnect 1301 and a second interconnect 1303) and associated conductive lines 700 and 702 (a first conductive line 700 and a second conductive line 702) are shown, wherein the conductive lines 700 and 702 are disposed on the substrate 100 shown in FIG. 2, or the first substrate 400 shown in FIG. 3. The first conductive lines 700, coupled to the first interconnect 1301, function to transmit the signals to operate three sub-pixels, such as a green sub-pixel, a blue sub-pixel, and a red sub-pixel. In other words, the interconnects 130 individually couples one of the conductive lines 702 and 702 to the corresponding one of the sub-pixels. The second conductive line 702, coupled to the second interconnect 1303, functions to transmit a signal applied to a common cathode and/or a common anode of the OLED device 110. In some embodiments, the conductive lines 700 and 702 are in a metal layer. In some embodiments, the conductive lines 700 and 702 are in different metal layers and are isolated from each other by a dielectric layer (not shown).

Figure 10:
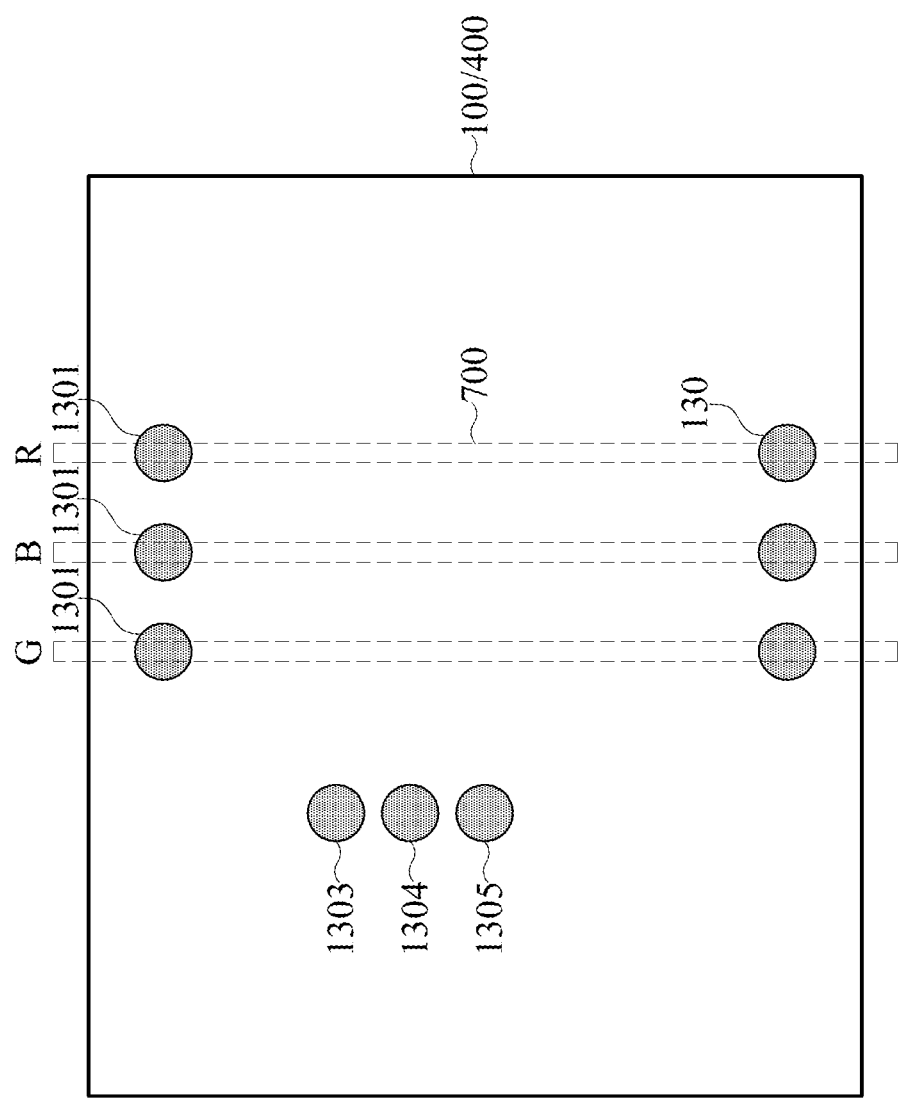
FIG. 10 is another layout of an AMOLED display from a top view, in accordance with some embodiments of the present disclosure.

FIG. 10 is another layout of the AMOLED display 10, 20, 30, 40, 50 and/or 60 from top view, in accordance with some embodiments of the present disclosure. Referring to FIG. 10, for the pixel 112, the layout further includes interconnects 1303, 1304 and 1305 (a third interconnect 1304 and a fourth interconnect 1305). The interconnect 1303, 1304, and 1305 is responsible for either the anode or cathode of each sub-pixel. In some embodiments, the interconnects 1303, 1304 and 1305 include a contact.

Figure 11:
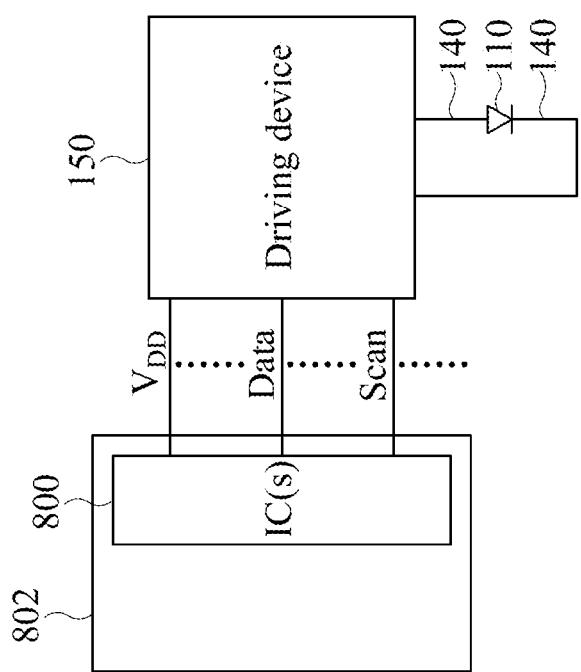
FIG. 11 is a circuit diagram of an AMOLED display, in accordance with some embodiments of the present disclosure.

FIG. 11 is a circuit diagram of an AMOLED display, in accordance with some embodiments of the present disclosure. Referring to FIG. 11, there are many lines of supply voltage $V_{DD}$, scan line, and data line connected from IC 800 to driving device 150. The driving device 150 and an integrated circuit (labeled, IC(s)) 800 are coupled to scan lines, and data lines, and receive, many lines of supply voltage $V_{DD}$. In some embodiments, the IC(s) 800 may be gate and source driver IC, or controller IC. The IC(s) 800 is disposed on the flex (COF or FPC) 802.

Figure 12:
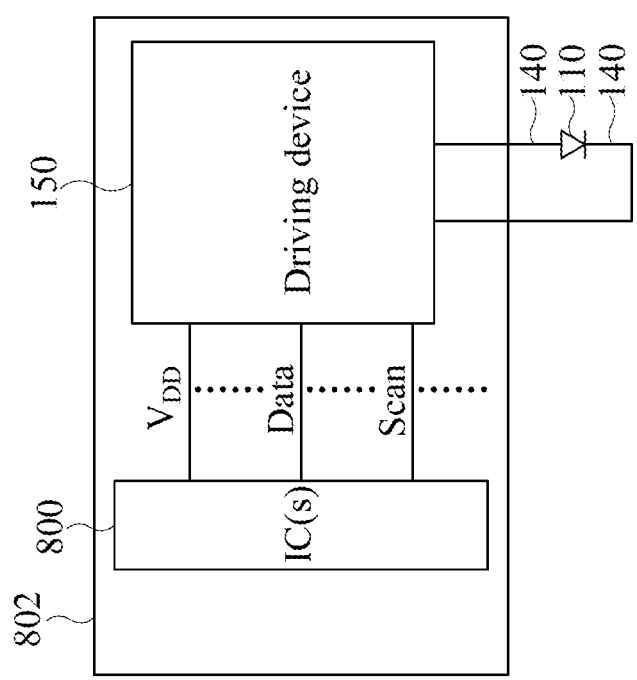
FIG. 12 is a circuit diagram of an AMOLED display, in accordance with some embodiments of the present disclosure.

FIG. 12 is a circuit diagram of an AMOLED display, in accordance with some embodiments of the present disclosure. Referring to FIG. 12, the driving device 150 is separate with OLED device 110 in different substrate and disposed on the flex (COF or FPC) 802 which shares the same substrate with IC(s) and then connect to the OLED device 110 through the redistribution layer 140.

Figure 13:
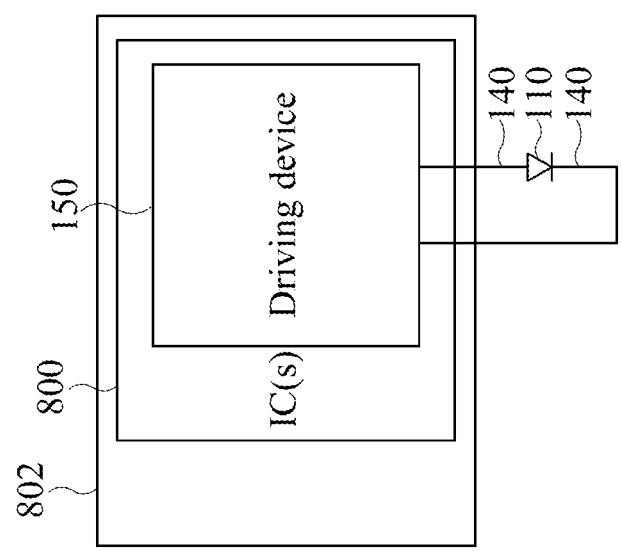
FIG. 13 is a circuit diagram of an AMOLED display, in accordance with some embodiments of the present disclosure.

FIG. 13 is a circuit diagram of an AMOLED display, in accordance with some embodiments of the present disclosure. Referring to FIG. 13, the driving device 150 is separated with OLED device 110 in different substrate and integrated into part of IC(s) 800 and then is connected to the OLED device 110 through the redistribution layer 140.

One embodiment of the present disclosure provides an AMOLED display. The display includes a first substrate, an organic light-emitting diode (OLED) device, a plurality of conductive lines, a plurality of interconnects and a driving device. The first substrate includes a first surface and a second surface. The OLED device is disposed on and entirely in contact with the first surface of the first substrate. The OLED device includes a plurality of sub-pixels. Each sub-pixel includes an electrode layer, serving as one of a cathode and an anode of the OLED device, disposed on and entirely in contact with the first surface of the first substrate. The conductive lines are disposed on the first substrate. The interconnects are disposed in and penetrating the first substrate. The interconnects individually couple one of the conductive lines to the corresponding one of the sub-pixels. Each of the transistors is coupled to the one corresponding sub-pixel through the redistribution layer.

Another embodiment of the present disclosure provides a display. The display includes a first substrate, an organic light-emitting diode (OLED) device and a driving device. The first substrate includes a first surface, a second surface opposite to the first surface, a first region and a second region adjacent to the first region. The OLED device is disposed on the first surface and above the first region. The driving device is configured for driving the OLED device and disposed on the second surface and under the second region.

The scope of the present application is not intended to be limited to the particular embodiments of the process, machine, manufacture, and composition of matter, means, methods and steps described in the specification. As one of ordinary skill in the art will u) readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. An AMOLED, comprising:
    a first substrate;
    an organic light-emitting diode (OLED) device disposed on the first substrate;
    a plurality of conductive lines disposed on the first substrate and connected to the OLED device; and
    a driving device connected to the OLED device through the conductive lines, and configured to drive the OLED device, and disposed outside of the active area;
    wherein the AMOLED is free of thin-film transistors (TFT) in the active area.

2. The AMOLED of claim 1, wherein the first substrate is a polyimide (PI) substrate or an ultra-thin glass (UTG) substrate.

3. The AMOLED of claim 1, wherein the driving device is disposed on one of the first and second surfaces of the first substrate.

4. The AMOLED of claim 1, further comprising:
    a passivation layer disposed on the OLED device, wherein the OLED device provides a top-emission function.

5. The AMOLED of claim 4, wherein the OLED device is disposed on the first substrate by being formed on the first substrate.

6. The AMOLED of claim 1, further comprising:
    a second substrate, disposed on the OLED device, wherein the OLED device provides a bottom-emission function.

7. The AMOLED of claim 6, wherein the second substrate is disposed on the OLED device by formation of the OLED device on the second substrate.

8. The AMOLED of claim 7, wherein the second substrate is disposed on the OLED device by formation of the OLED device on the first substrate.

9. An AMOLED, comprising:
a first substrate comprising a first surface, a second surface opposite to the first surface, a first region and a second region adjacent to the first region;
an organic light-emitting diode (OLED) device, disposed on the first surface and above the first region; and
a driving device configured for driving the OLED device and disposed on the second surface and under the second region,
wherein the first region is disposed within an active area of the AMOLED, and the second region is disposed within a non-active area of the AMOLED, and the AMOLED is free of thin-film transistors (TFT) in the active area.

10. The AMOLED of claim 9, further comprising:
an interconnect, disposed in the first substrate and penetrating from the first surface to the second surface of the first substrate, and configured for electrical connection to the OLED device.

11. The AMOLED of claim 10, further comprising:
a plurality of conductive lines disposed on the first substrate and coupling the interconnect to the driving device.

12. The AMOLED of claim 9, wherein the OLED device disposed above the driving device is absent.

13. An AMOLED, free of thin-film transistors (TFT) in the active area of the AMOLED and comprising:
a first substrate comprising a first surface, a second surface opposite to the first surface, a first region and a second region adjacent to the first region;
an organic light-emitting diode (OLED) device, disposed on the first surface and above the first region; and
a driving device configured for driving the OLED device;
wherein the first region is disposed within the active area of the AMOLED and is free of the thin-film transistors (TFT) of the AMOLED, and wherein the second region is disposed within a non-active area of the AMOLED.

* * * * *